United States Patent [19]

Sato

[11] Patent Number: 4,761,199
[45] Date of Patent: Aug. 2, 1988

[54] SHUTTER DEVICE FOR ION BEAM ETCHING APPARATUS AND SUCH ETCHING APPARATUS USING SAME

[75] Inventor: Yasue Sato, Kawasaki, Japan

[73] Assignee: Canon Kabushiki Kaisha, Tokyo, Japan

[21] Appl. No.: 849,443

[22] Filed: Apr. 8, 1986

[30] Foreign Application Priority Data

Apr. 10, 1985 [JP] Japan .................................. 60-74425
Apr. 12, 1985 [JP] Japan .................................. 60-78781

[51] Int. Cl.⁴ ............................................... C23F 1/02
[52] U.S. Cl. ................................ 156/345; 204/192.34; 204/298
[58] Field of Search ................ 250/398, 492.2, 492.21; 156/345, 643, 646; 204/298, 192 E, 192.34

[56] References Cited

U.S. PATENT DOCUMENTS 4,491,499 1/1985 Jerde et al. ...................... 156/643 X
4,496,425 1/1985 Kuyel .............................. 156/643 X
4,523,971 6/1985 Cuomo et al. .................. 156/646 X
4,659,449 4/1987 Watanabe .......................... 156/345

FOREIGN PATENT DOCUMENTS 58-225637 6/1982 Japan .................................. 156/345

Primary Examiner—Kenneth M. Schor
Attorney, Agent, or Firm—Fitzpatrick, Cella, Harper & Scinto

[57] ABSTRACT

A shutter device for use in an etching apparatus using charged particles, which includes at least one sheet-like electrode having an aperture for passage of the charged particles; and a voltage source for selectively applying to the electrode an electric voltage so as to establish at the electrode an electric potential higher than that of the charged particles; wherein the passage of the charged particles through the aperture of said electrode is prevented when the electric potential which is higher than that of the charged particles is established at the electrode by the voltage application by the voltage source.

3 Claims, 3 Drawing Sheets

SHUTTER DEVICE FOR ION BEAM ETCHING APPARATUS AND SUCH ETCHING APPARATUS USING SAME

FIELD OF THE INVENTION AND RELATED ART

This invention relates to a shutter device and, more particularly, to a shutter device usable, for example, in a semiconductor circuit manufacturing apparatus such as an ion beam etching apparatus, for controlling passage of a beam of charged particles such as an ion beam. In another aspect, the invention is concerned with an ion beam etching apparatus using a shutter device as aforesaid.

FIG. 1 of the drawings attached to this Specification shows an example of conventional ion beam etching apparatus of the Kaufman type for use in the manufacture of semiconductor devices such as integrated circuits. As shown in FIG. 1, the etching apparatus includes a vacuum chamber 1 having an upper portion defining a plasma generating portion and a lower portion defining a space for accommodating a workpiece such as a semiconductor wafer 10. For operation, the vacuum chamber 1 is first evacuated and then supplied with a gas such as argon (Ar), carbon tetrafluoride ($CF_4$) or the like. A filament 5, usually formed of tungsten, is provided to emit thermoelectrons. An anode 6, usually formed of molybdenum, is provided to accelerate electrons with the aid of an electric voltage applied between it and the electron emitting filament 5, thereby to attract the electrons. Disk-like electrodes 7a–7c each having fine apertures are provided to accelerate gas ions contained in a gas plasma produced in the neighborhood of the filament 5 and the anode 6. More specifically, an electron flow is produced between the electron emitting filament 5 and the anode 6, and the electrons in the flow impinge against molecules of the argon gas existing in this portion, with the result that the argon gas molecules are electrolytically dissociated. Consequently, a gas plasma is produced in this portion and the argon gas ions (positive ions) generated are accelerated by the electrodes 7a–7c to thereby form ion beams directed to the wafer 10 held by a holder 9.

In conventional ion beam etching apparatuses such as of the type shown in FIG. 1, a shutter blade or blocking member 2 usually made of metal is provided between the holder 9 and the electrodes 7a–7c so as to prevent incidence of the ions on the wafer 10 during replacement of the same by another semiconductor wafer. As shown in FIG. 1, the blocking member 2 is made rotatable about an axis, such that it is movable between a position interrupting the flow of the ion beams from the electrodes 7a–7c toward the wafer 10 and another position which does not interfere with the flow of ion beams. While not shown in FIG. 1, the apparatus further includes additional mechanisms and elements for allowing rotational movement of the blocking member 2. This leads to bulkiness of the etching apparatus itself. Also, it is necessary to provide the moving portion for the blocking member 2 with vacuum sealing means, which makes the structure complicated. Further, to operate mechanically the blocking member 2 necessarily has unsatisfactory response, controllability and reliability. In addition thereto, it is possible that the surface of the blocking member 2 is subjected to sputtering by the impingement of the ion beams or that lubricating oil used in the moving portion is affected by the ions, which causes contamination of the interior of the ion beam etching apparatus, and in the worst case, contamination of the surface of the wafer 10.

SUMMARY OF THE INVENTION

It is accordingly a primary object of the present invention to provide a shutter device for use in an etching apparatus using charged particles such as ions, which device allows interception of the charged particles, when it is desired, with a simple and compact structure and without causing problems such as described in the foregoing.

It is another object of the present invention to provide a shutter device for use in an etching apparatus using charged particles such as ions, which device allows interception of the charged particles, when it is desired, without use of any movable component.

It is a further object of the present invention to provide an etching apparatus using charged particles such as ions, in which apparatus interception of the charged particles when it is desired is assured without causing undesirable contamination within the etching apparatus.

Briefly, according to one aspect of the present invention, there is provided a shutter device for use in an etching apparatus using charged particles, said device comprising at least one sheet-like electrode having an aperture for passage of the charged particles; and voltage applying means for selectively applying to said electrode an electric voltage so as to establish at said electrode an electric potential higher than that of the charged particles; wherein the passage of the charged particles through said aperture of said electrode is prevented when the electric potential which is higher than that of the charged particles is established at said electrode by the voltage application by said voltage applying means. As will be understood from the following description of the preferred embodiments of the present invention, the interception of the charged particles is attained in the shutter device of the present invention by controlling an electric potential at a position in the path or flow of the charged particles, relative to the electric potential of the charged particles.

According to another aspect of the present invention, there is provided an etching apparatus using charged particles, said apparatus comprising: generating means for generating charged particles; beam forming means for operating on the charged particles generated by said generating means to form a beam of charged particles directed toward an object having a surface to be etched; and shutter means arranged to selectively provide an electric potential which is higher than that of the charged particles and which acts against the charged particles to block flow of them toward the object having the surface to be etched.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 2:
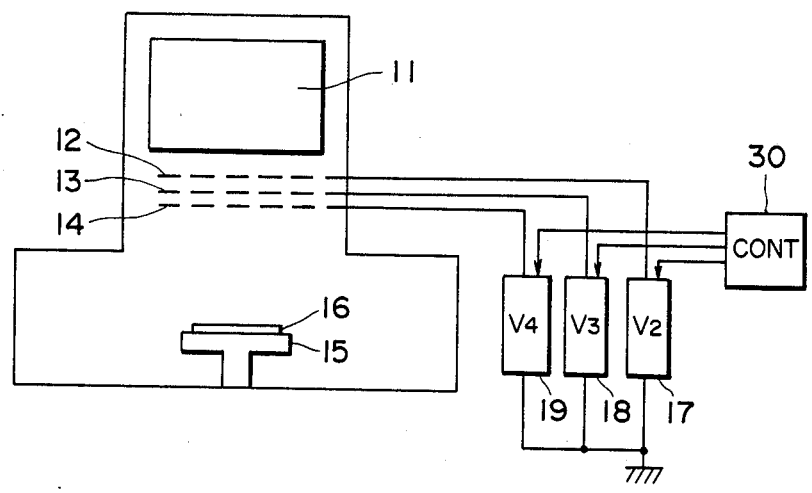
FIG. 2 is a schematic view of an ion beam etching apparatus according to a first embodiment of the present invention.

Referring now to FIG. 2, there is shown an ion beam etching apparatus according to a first embodiment of the present invention, particularly suitable for use in the manufacture of semiconductor devices.

Figure 1:
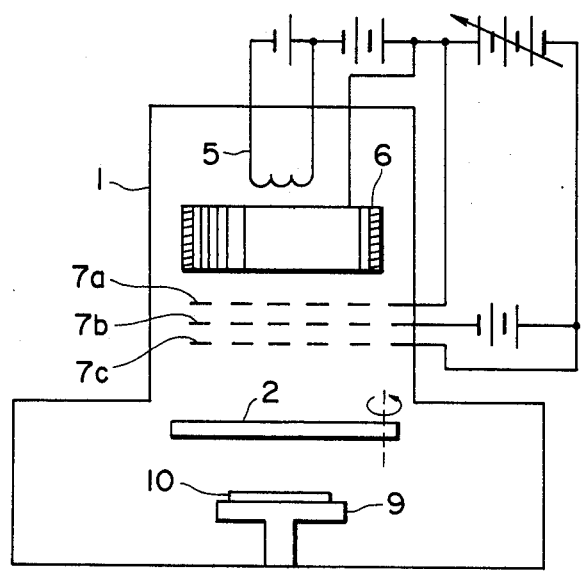
FIG. 1 is a schematic view showing an example of conventional ion beam etching apparatus of the Kaufmann type, having a mechanical ion-blocking member.

Denoted by numeral 11 in FIG. 2 is a plasma generating portion in which plasma generating electrodes of the type such as shown in FIG. 1 or non-heating type plasma generating electrodes, which are known per se, are disposed. In the interior of the ion beam etching apparatus, three plate-like electrodes 12-14 each having fine apertures, and a holder 15 for holding a semiconductor wafer 16, are disposed. While not shown in FIG. 2, the holder 15 is grounded or earthed and, so, the wafer 16 carried on the holder 15 is also grounded or earthed.

The etching apparatus further includes DC electric power sources 17-19 which are electrically connected respectively to the electrodes 12-14 so as to apply electric voltages to the electrodes 12-14, respectively. Each of the power sources 17-19 is adapted to change the electric voltage to be applied to a corresponding one of the electrodes 12-14. By means of the electrodes 12-14 when they are supplied with specific voltages from the power sources 17-19, etching gas ions (positive ions) such as $Ar^+$, $CF^{3+}$ or the like produced in the region of the plasma generating portion 11 are drawn through the apertures of the electrodes 12-14 toward the wafer 16.

Also in the etching apparatus of the present embodiment, it is necessary that the ion beams are interrupted when the wafer 16 is to be replaced by another semiconductor wafer. However, no mechanical shutter device such as the metallic blocking member 2 shown in FIG. 1 is provided in the etching apparatus of the present embodiment. In place thereof, the electrodes 12-14 and the power sources 17-19 which are used to attract and accelerate the gas ions to form the ion beams, are used also as means for interrupting the flow of ions directed to the wafer 16. More specifically, the etching apparatus of the present embodiment further includes a power source control unit 30 which is electrically connected to each of the power sources 17-19. The control unit 30 is arranged to control, in response to instructions supplied thereto from an operator, each of the power sources 17-19 so as to change the electric voltage to be applied to a corresponding one of the electrodes 12-14. That is, for the sake of attraction and acceleration of the gas ions and for the sake of interruption of the flow of ions, the voltages to be applied to the electrodes 12-14 are changed.

Details of the manner of voltage application to the electrodes 12-14 will now be described.

First, for the sake of ion acceleration, the following condition should be satisfied between the voltages V2, V3 and V4 which are to be applied to the electrodes 12-14, respectively:

Condition 1

$$\begin{cases} V2 > V3 \\ V2 > 0 \\ V2 > V4 \end{cases}$$

When this relation is established between the voltages V2-V4, the positive ions are accelerated and drawn through the apertures of the electrodes 12-14 toward the wafer 16.

Then, for the sake of interception of the positive ions, the following condition should be satisfied:

Condition 2

$$\begin{cases} V2 > V3 \\ V2 < V4 \text{ or } V2 < 0 \end{cases}$$

Alternatively, $$\begin{cases} V2 < V3 \\ V2 > V4 \text{ or } V2 > 0 \end{cases}$$

When one of these relations is established, the positive ions are blocked. Simultaneously, the electrons existing in the region of the plasma generating portion 11 are also prevented from being drawn toward the wafer 16. The blockage of the electrons, as well as the positive ions, is very effective because it avoids any undesirable damage of the wafer surface during a non-etching mode.

In accordance with the above-described finding of the conditions to be established between the voltages V2-V4, the control unit 30 controls the voltage sources 17-19 so that the condition (1) is satisfied where the positive ions are to be accelerated and so that the condition (2) is satisfied where the positive ions are to be blocked. As for the voltages V2-V4 complying with the conditions (1) and (2), appropriate values are set in preparation in the control unit 30. Of course, the system may be arranged so that these values for the voltages V2-V4 can be modified by the operator, as desired.

The above-described conditions (1) and (2) have been settled while considering a case where the ions existing in a region in the neighborhood of the first electrode (electrode 12) have little kinetic energy. That is, no specific attention has been paid to the energies of the ions and electrons which are just going to be incident on the first electrode 12. It is however possible that the ions have high energy of an order of several hundreds of electron volts (eV), in a case where high-frequency electric discharge using no electrode and using application of low-frequency AC voltage is adopted. So, in such case, the kinetic energies of the ions and electrons are not negligible. Accordingly, in such case, the conditions for the voltages V2-V4 to be applied respectively to the electrodes 12-14 should be determined while taking the kinetic energies of the ions and electrons into account. That is, for the sake of ion acceleration, the voltages V2-V4 should be in a relation satisfying the following condition:

Condition 3

-continued $$\begin{cases} V2 + Ei/q > V3 \\ V2 + Ei/q > V4 \\ V2 + Ei/q > 0 \end{cases}$$

wherein Ei is the average energy of the ions which are just going to be incident on the first electrode 12, Ee will be taken to be the average energy of the electrons which are just going to be incident on the first electrode 12, q is the electric charge of the ion and e will be taken to be the electric charge of the electron. When the condition (3) is satisfied, only the positive ions are accelerated and drawn toward the wafer.

On the other hand, for the sake of interruption of the positive ions, the voltages V2-V4 should satisfy the following condition:

Condition 4

$$\begin{cases} V2 > V3 \\ V2 + Ei/q < V4 \text{ or } V2 + Ei/q < 0 \end{cases}$$

Alternatively, $$\begin{cases} V2 + Ei/q < V3 \\ V2 + Ee/e > V4 \text{ or } V2 + Ee/e > 0. \end{cases}$$

When one of the two relations is satisfied, both the positive ions and the electrons are blocked.

In accordance with the above-described finding, the control unit 30 controls the voltage sources 17–19, whereby the interception of the ions and electrons is attained, as is desired, without use of any mechanical blocking member.

In this embodiment, as described, the electrodes 12–14 are used as the ion accelerating means and also as the ion intercepting means and, thus, the mechanical shutter blade 2 shown in FIG. 1 is omitted. However, it will be understood that the electrodes 12–14 may be used simply as the ion accelerating means and, in place thereof, an additional electrode may be provided at a position corresponding to the position of the shutter blade 2. In such case, the interception of the beams of positive ions is attainable only by controlling an electric voltage to be applied to the additional or fourth electrode so that an electric potential which is higher than that of the ions is established at the fourth electrode.

Figure 3:
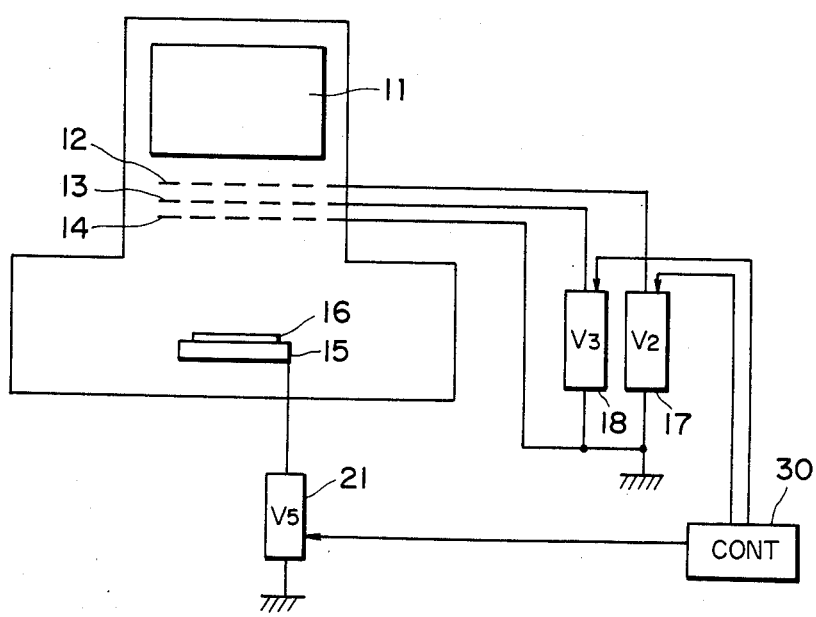
FIG. 3 is a schematic view of an ion beam etching apparatus according to a second emmbodiment of the present invention.

FIG. 3 is a schematic view showing an ion beam etching apparatus according to another embodiment of the present invention. In FIG. 3, elements having similar or corresponding functions as of those of the FIG. 2 embodiment are denoted by the same reference numerals.

The major distinction of the present embodiment over the FIG. 2 embodiment lies in that a DC electric power source 21 providing variable output voltage is electrically connected to a holder 15 for holding the wafer 16, and in that the third electrode 14 is grounded. As shown in FIG. 3, the control unit 30 is electrically connected to each of the power sources 17, 18 and 21.

Details of the manner of voltage application to the electrodes 12 and 13 and to the holder 15, for the sake of acceleration and attraction of the argon gas ions existing in the region of the plasma generating portion 11 and for the sake of interception of the flow of ions, will now be described.

First, for the sake of ion acceleration, the following condition should be satisfied between the voltages V2, V3 and V5 which are to be applied to the electrodes 12 and 13 and the holder 15, respectively:

Condition 5

$$\begin{cases} V2 > V3 \\ V2 > 0 \\ V2 > V5 \end{cases}$$

When this relation is established between the voltages V2, V3 and V5, the positive ions are accelerated and drawn through the apertures of the electrodes 12–14 toward the wafer 16.

Then, for the sake of interception of the positive ions, the following condition should be satisfied:

Condition 6

$$\begin{cases} V2 > V3 \\ V2 < V5 \text{ or } V2 < 0 \end{cases}$$

Alternatively, $$\begin{cases} V2 < V3 \\ V2 > V5 \text{ or } V2 > 0 \end{cases}$$

When one of the two relations is established, both the positive ions and the electrons are blocked.

The conditions (5) and (6) set forth above have been settled while paying no specific attention to the energies of the ions and electrons which are just going to be incident on the first electrode 12. It is however possible that the ions have high energy of an order of several hundreds of electron volts (eV), in a case where high-frequency electric discharge using no electrode and using application of low-frequency AC voltage is adopted. So, in such case, the kinetic energies of the ions and electrons are not negligible. Accordingly, in such case, the conditions for the voltages V2, V3 and V5 to be applied respectively to the electrodes 12 and 13 and the holder 15 should be determined while taking the kinetic energies of the ions and electrons into account.

That is, for the sake of ion acceleration, there should be established the following condition:

Condition 7

$$\begin{cases} V2 + Ei/q > V3 \\ V2 + Ei/q > 0 \\ V2 + Ei/q > V5 \end{cases}$$

When the condition (7) is satisfied, the positive ions are accelerated and attracted toward the wafer.

On the other hand, for the sake of interruption of the positive ions, the voltages V2, V3 and V5 should satisfy the following condition:

Condition 8

-continued $$\begin{cases} V2 > V3 \\ V2 + Ei/q < V5 \text{ or } V2 + Ei/q < 0 \end{cases}$$

Alternatively, $$\begin{cases} V2 + Ei/q < V3 \\ V2 + Ee/e > V5 \text{ or } V2 + Ee/e > 0. \end{cases}$$

When one of the two relations is satisfied, both the positive ions and the electrons are blocked.

In accordance with the above-described finding, the control unit 30 controls the voltage sources 17, 18 and 21, whereby the interception of the ions and electrons is attained, as is desired, without use of any mechanical blocking member.

Figure 4:
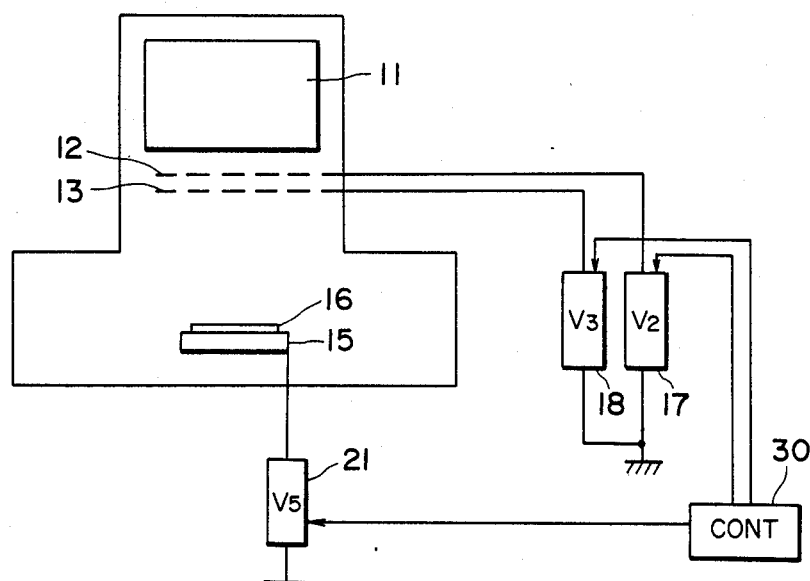
FIG. 4 is a schematic view of an ion beam etching apparatus according to a third embodiment of the present invention.

FIG. 4 is a schematic view showing an ion beam etching apparatus according to a further embodiment of the present invention. In FIG. 4, elements having similar or corresponding functions as of those of the foregoing embodiments are denoted by the same reference numerals.

The major distinction of the present embodiment over the FIG. 3 embodiment lies in that the third electrode 14 of the FIG. 3 embodiment is omitted. Each of the DC voltage sources 18, 17 and 21 is arranged to change its output voltage, in response to the instruction signal applied thereto from the control unit 30.

Details of the manner of voltage application to the electrodes 12 and 13 and to the holder 15, for the sake of acceleration and attraction of the argon gas ions existing in the region of the plasma generating portion 11 and for the sake of interruption of the beams of ions, will now be described.

First, for the sake of ion acceleration, the following condition should be satisfied between the voltages V2, V3 and V5 which are to be applied to the electrodes 12 and 13 and the holder 15, respectively:

Conditions 9

$$\begin{cases} V2 > V3 \\ V2 > V5 \end{cases}$$

When this relation is established between the voltages V2, V3 and V5, the positive ions are accelerated and drawn through the apertures of the electrodes 12–14 toward the wafer 16.

Then, for the sake of interception of the positive ions, the following condition should be satisfied:

Condition 10

$$\begin{cases} V2 > V3 \\ V2 < V5 \end{cases}$$

Alternatively, $$\begin{cases} V2 < V3 \\ V2 > V5 \end{cases}$$

The conditions (9) and (10) set forth above have been settled while paying no specific attention to the energies of the ions and electrons which are just going to be incident on the first electrode 12. It is however possible that the ions have high energy of an order of several hundreds of electron volts (eV), in a case where high-frequency electric discharge using no electrode and using application of low-frequency AC voltage is adopted. So, in such case, the kinetic energies of the ions and electrons are not negligible. Accordingly, in such case, the conditions for the voltages V2, V3 and V5 to be applied respectively to the electrodes 12 and 13 and to the holder 15 should be determined while taking the kinetic energies of the ions and electrons into account.

That is, for the sake of ion acceleration, the voltages V2, V3 and V5 should be in a relation satisfying the following condition:

Condition 11

$$\begin{cases} V2 + Ei/q > V3 \\ V2 + Ei/q > V5 \end{cases}$$

When the condition (11) is satisfied, the positive ions are accelerated and drawn toward the wafer.

On the other hand, for the sake of interruption of the positive ions, the voltages V2, V3 and V5 should satisfy the following condition:

Condition 12

$$\begin{cases} V2 > V3 \\ V2 + Ei/q < V5 \end{cases}$$

Alternatively, $$\begin{cases} V2 + Ei/q < V3 \\ V2 + Ee/e > V5 \end{cases}$$

When one of these two relations is satisfied, both the positive ions and the electrons are blocked.

In accordance with the above-described finding, the control unit 30 controls the voltage source 17, 18 and 21, whereby the interception of the ions and electrons is attained, as is desired, without use of any mechanical blocking member.

Figure 5:
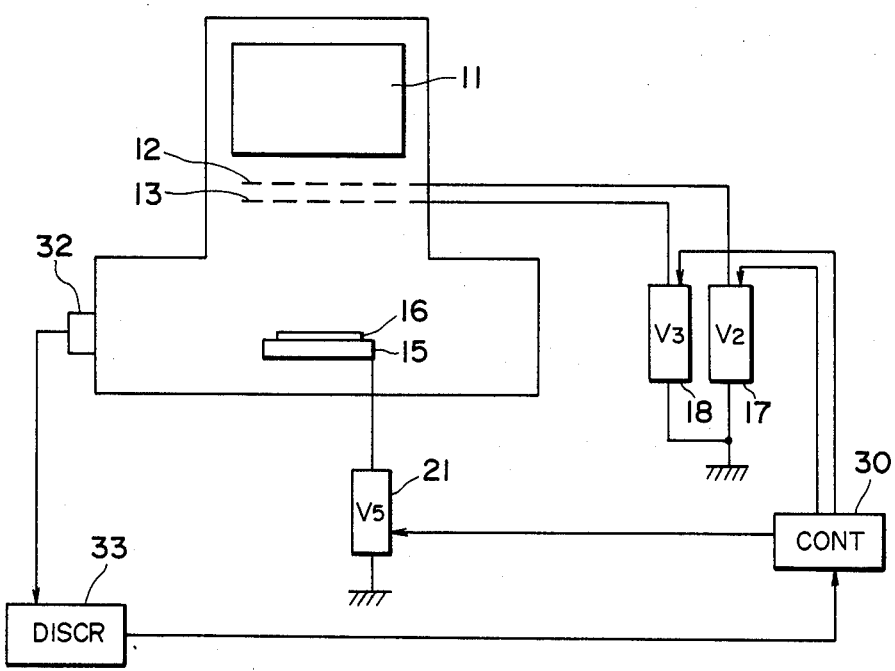
FIG. 5 is a schematic view of an ion beam etching apparatus according to a fourth embodiment of the present invention.

FIG. 5 is a schematic view showing an ion beam etching apparatus according to a still further embodiment of the present invention. In FIG. 5, elements having similar or corresponding functions as of those of the foregoing embodiments are denoted by the same reference numerals.

The major distinction of the present embodiment over the FIG. 4 embodiment lies in that the apparatus of the present embodiment is provided with an etching state detecting portion 32 and an etching completion discriminating portion 33. When the completion of the etching treatment is detected by the etching completion discriminating portion 33 with the aid of the etching state detecting portion 32, an instruction signal is supplied from the discriminating portion 33 to the voltage source controlling unit 30, such that the voltages V2, V3 and V5 to be applied respectively to the electrodes 12 and 13 and to the holder 15 are controlled so as to satisfy the condition (12) chosen for the interception of positive ions, in substitution for the condition (11) chosen for the ion acceleration.

More specifically, upon start of the etching treatment, the voltage source controlling unit 30 supplies, in response to the instructions applied thereto from the operator, instruction signals to the voltage sources 17, 18 and 21 so as to control them, such that voltages V2, V3 and V5 satisfying the condition (11) are applied to the electrodes 12 and 13 and to the holder 15. By this condition, the positive ions are accelerated and attracted toward the wafer 16. During the etching treatment, the state of etching is detected by the etching state detecting portion 32. As an example, the etching state detecting portion 32 is arranged to detect the state of etching by detecting light emitted, during the etching treatment, from reactants and/or product of reaction. That is, the light emitted from the reactants or the product of reaction is filtered or is subjected to spectral analysis by use of a monochromator, such that a component of the light having a particular wavelength is converted into an electric signal by photoelectric conversion. The thus obtained electric signal is amplified. Since the level of such electric signal is changed in accordance with the state of etching, the completion of the etching treatment can be detected by analysing the electric signal. The etching completion discriminating portion 33 receives an output signal from the etching state detecting portion 32 and processes the same. When the completion is discriminated, the discriminating portion 33 supplies an instruction signal to the power source controlling unit 30. In response thereto, the controlling unit 30 controls the voltage sources 17, 18 and 21 so as to provide voltages satisfying the condition (12) set for the interception of the positive ions. By doing so, the ion beams are automatically interrupted upon completion of the etching treatment. The arrangement for allowing automatic interruption of the ion beams may of course be incorporated into the ion beam etching apparatuses of the FIGS. 2 and 3 embodiments. Also, the etching treatment may of course be effected by use of electron beams, in place of the ion beams.

While the invention has been described with reference to the structures disclosed herein, it is not confined to the details set forth and this application is intended to cover such modifications or changes as many come within the purposes of the improvements or the scope of the following claims.

What is claimed is:

1. An etching apparatus using charged particles, said apparatus comprising:
   generating means for generating charged particles;
   electrode means for operating on said charged particles, said electrode means functioning as (1) beam forming means for operating on the charged particles generated by said generating means to form a beam of charged particles directed toward an object having a surface to be etched and (2) shutter means for blocking substantially all flow of said charged particles toward the surface of the object;
   voltage producing means operable to produce an electric voltage, applied to said electrode means, that is effective to create an electric potential that either functions to block substantially all flow of charged particles toward the surface of the object or functions to form said beam of charged particles; and
   control means for controlling said voltage producing means such that the electrode means will function as said shutter means.

2. An apparatus according to claim 1, wherein said electrode means includes a plurality of electrodes, said voltage producing means applying electric voltages respectively to said electrodes, and wherein said control means controls said voltage producing means so as to control the electric voltages to be applied respectively to said electrodes, wherein said electrodes function as said beam forming means when they are supplied with predetermined electric voltages by said voltage producing means under the control of said control means, and wherein said electrodes function as said shutter means when they are supplied with another set of predetermined electric voltages by said voltage producing means under the control of said control means.

3. An apparatus according to claim 1, wherein said generating means is a means for providing positive ions as the charged particles to be formed into the beam.

* * * * *

UNITED STATES PATENT AND TRADEMARK OFFICE
CERTIFICATE OF CORRECTION

PATENT NO. : 4,761,199
DATED : August 2, 1988
INVENTOR(S) : YASUE SATO

It is certified that error appears in the above-identified patent and that said Letters Patent is hereby corrected as shown below:

COLUMN 2

Line 45, "comprising:" should read --comprising--.

COLUMN 3

Line 2, "emmbodiment" should read --embodiment--.
Line 37, "$CF^{3+}$" should read --$CF_3^+$--.

COLUMN 7

Line 42, "Conditions 9" should read --Condition 9--.

COLUMN 8

Line 43, "source" should read --sources--.

COLUMN 9

Line 43, "many" should read --may--.

Signed and Sealed this

Twenty-eighth Day of March, 1989

Attest:

DONALD J. QUIGG

Attesting Officer

Commissioner of Patents and Trademarks